United States Patent [19]

Fukagai

[11] Patent Number: 5,530,713
[45] Date of Patent: Jun. 25, 1996

[54] STRAINED LAYER INGAAS QUANTUM WELL SEMICONDUCTOR LASER ON GAAS SUBSTRATE WITH QUANTUM WELL-BARRIER LAYER INTERFACE STRUCTURE

[75] Inventor: Kazuo Fukagai, Tokyo, Japan

[73] Assignee: NEC Corporation, Tokyo, Japan

[21] Appl. No.: 410,304

[22] Filed: Mar. 24, 1995

[30] Foreign Application Priority Data

Mar. 24, 1994 [JP] Japan .................................. 6-053686
Aug. 11, 1994 [JP] Japan .................................. 6-189537

[51] Int. Cl.$^6$ .................................................... H01S 3/18
[52] U.S. Cl. ............................................. 372/45; 257/18
[58] Field of Search ......................... 257/18, 24; 372/45, 372/96

[56] References Cited

U.S. PATENT DOCUMENTS 5,198,879  3/1993  Oshima ..................................... 257/24
5,234,848  8/1993  Seabaugh ................................. 257/24

OTHER PUBLICATIONS

Y. Chen et al., "High-Power 980-nm AlGaAs/InGaAs Strained Quantum-Well Lasers Grown by OMVPE", IEEE Photonics Technology Letters, vol. 3, No. 5, pp. 406–408. May 1991.

A. Moore et al., "The performance and reliability of 800–880 nm InAlGaAs/AlGaAs and InGaAs/AlGaAs strained layer ridge waveguide lasers", Journal of Crystal Growth, 1992, vol. 124, pp. 703–708. (No month available).

L. Heath et al., "980 nm ridge waveguide laser reliability at 100 mW", Applied Physics Letters, Apr. 19, 1993, vol. 62, pp. 1869–1871.

Primary Examiner—Rodney B. Bovernick
Assistant Examiner—Robert McNutt
Attorney, Agent, or Firm—Young & Thompson

[57] ABSTRACT

A semiconductor double heterostructure formed on a GaAs substrate having an off (100) plane slightly tilted toward a predetermined direction, the double heterostructure including an InGaAs quantum well active strained layer sandwiched between potential barrier layers and including an interface between the InGaAs quantum well active strained layer and an upper potential barrier layer grown on the active strained layer, wherein the interface has a periodical ridge-like bunching structure comprising quadrilateral waveform parts and triangular waveform parts, each of the quadrilateral waveform parts comprises a series of a bottom terrace of the just (100) plane, a reverse direction multiple step plane largely tilted from (100) direction toward the opposite direction to the predetermined direction, a top terrace of the just (100) plane and a forward direction multiple step plane largely tilted from (100) direction toward the predetermined direction, each of the triangular waveform parts comprises the just (100) plane terrace and the forward direction multiple step plane largely tilted from (100) direction toward the predetermined direction.

20 Claims, 8 Drawing Sheets

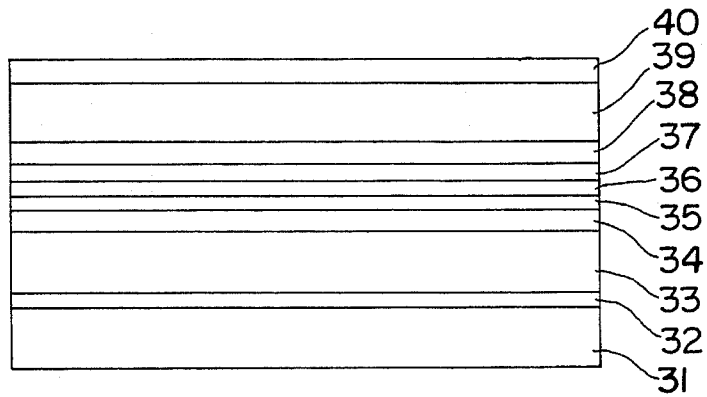
FIG. I
PRIOR ART
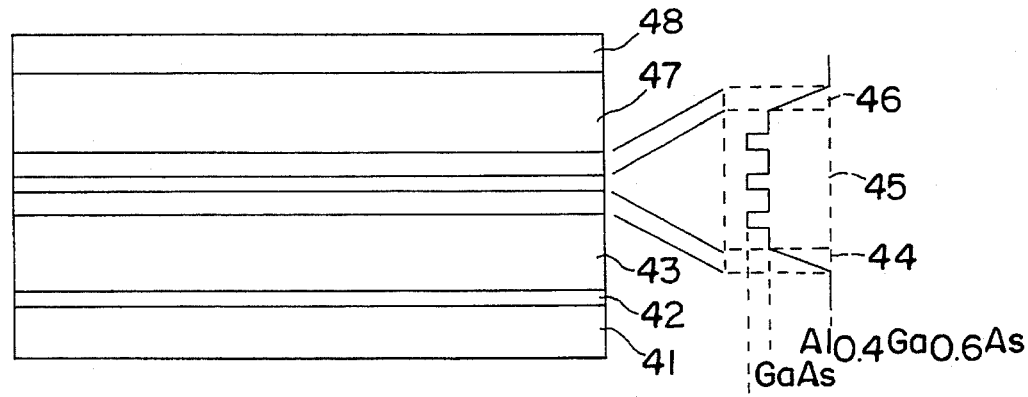
FIG. 2
PRIOR ART
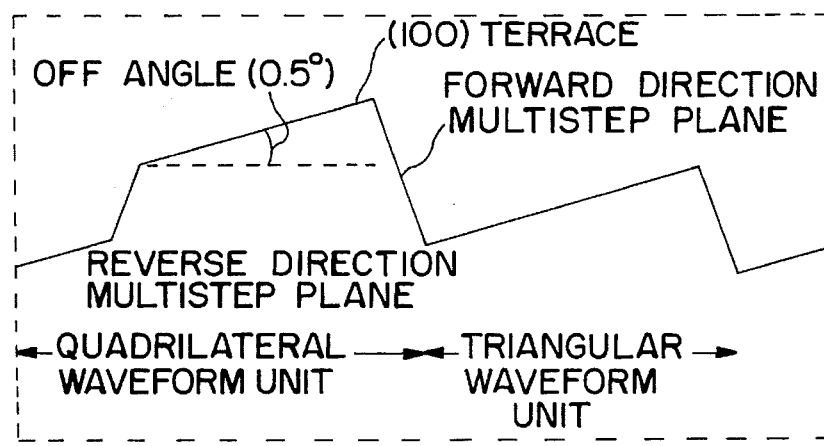
FIG. 3

MULTIPLE STEP PLANE GROWTH MODE

STRAINED LAYER INGAAS QUANTUM WELL SEMICONDUCTOR LASER ON GAAS SUBSTRATE WITH QUANTUM WELL-BARRIER LAYER INTERFACE STRUCTURE

BACKGROUND OF THE INVENTION

The invention relates to a semiconductor laser device, and more particularly to a stained layer InGaAs quantum well semiconductor laser device formed on a GaAs substrate.

Recently, the strained layer InGaAs quantum well semiconductor laser on a GaAs substrate has been receiving a great interest for application to a long wavelength laser device. Importance in research and development for improvement of the strained layer InGaAs quantum well semiconductor laser will be on the increase. Typically, the strained layer InGaAs quantum well semiconductor laser has a double heterostructure comprising an InGaAs active layer and potential barrier layers sandwiching the active layer.

One of the most important factors for determining a possible high performance of the laser device is a quality of an interface between the InGaAs active layer and a potential barrier layer formed on the InGaAs active layer. Lattice defect free interface including completely no crystal defect nor lattice defect would be desired for obtaining an ideal property of the laser device. Another important factor for determining the device performance would aloe be a quality of the active layer. Introduction of the strained layer for the active layer serving as the quantum well is preferable to suppress increase of the defects within the active layer and on the interface between the active layer and the upper potential barrier layer formed on the active layer.

The strained layer may also contribute a reduction, due to a compressive stress, of a threshold current at or over which a laser emission may be obtained. The reduction of the threshold current is still another most important factor for the laser device. Since InGaAs for the active layer serving as the quantum well has a larger lattice constant than a lattice constant of the GaAs substrate, the InGaAs active layer formed on the GaAs substrate would be strained. That is why the InGaAs active layer is introduced in the GaAs substrate laser device.

Some types of the strained layer InGaAs quantum well semiconductor laser on the GaAs substrate have already been known in the art, typical one of which is disclosed in April 1993 Applied Physics Letters vol. 62, 16 1869–1871. A strained layer InGaAs quantum well laser is formed on a (100) GaAs substrate by use of organometallic vapor phase epitaxy in an atmospheric-pressure. This laser device falls into one of the typical laser devices wherein the substrate has a (100) plane with zero off angle.

This laser device formed on the (100) GaAs substrate will be described with reference to FIG. 1. An n-type (100) GaAs substrate 31 is prepared on which an n-type GaAs buffer layer 32 having a thickness of 0.1 micrometers is formed. An n-type $Al_{0.6}Ga_{0.4}As$ cladding layer 33 having a thickness of 2.5 micrometers is grown on the n-type GaAs buffer layer 32. An $Al_{0.35}Ga_{0.65}As$ optical guide layer 34 having a thickness of 0.1 micrometers is grown on the $Al_{0.6}Ga_{0.4}As$ cladding layer 33. A GaAs potential barrier layer 35 having a thickness of 6 nanometers is grown on the $Al_{0.35}Ga_{0.65}As$ optical guide layer 34. An $In_{0.2}Ga_{0.8}As$ strained quantum well active layer 36 having a thickness of 6 nanometers is grown on the GaAs potential barrier layer 35. A GaAs potential barrier layer 37 having a thickness of 6 nanometers is grown on the $In_{0.2}Ga_{0.8}As$ strained quantum well active layer 36. An $Al_{0.35}Ga_{0.65}As$ optical guide layer 38 having a thickness of 0.1 micrometers is grown on the GaAs potential barrier layer 37. A p-type $Al_{0.6}Ga_{0.4}As$ cladding layer 39 having a thickness of 2.5 micrometers is grown on the $Al_{0.35}Ga_{0.65}As$ optical guide layer 38. A p-type GaAs cap layer 40 having a thickness of 0.25 micrometers is grown on the p-type $Al_{0.6}Ga_{0.4}As$ cladding layer 39 to thereby form a wafer including the double heterostructure for subsequent formation of a ridge waveguide, resulting in a formation of the strained layer quantum well semiconductor laser.

The laser obtained shows a laser emission at a wavelength of 0.98 micrometers. The laser device was subjected to a constant current aging test at an initial output power of 100 mW and a temperature of 25° C. to thereby confirm that the laser device has a performance stability at $4 \times 10^{-6}$/h of a degradation rate equivalent to an average operating current.

The above type of the laser device wherein the double heterostructure is formed on the (100) plane of the GaAs substrate has a good flatness of an interface between the strained layer InGaAs quantum well and the GaAs potential barrier layer overlying the quantum well layer because a growing surface of the wafer has only a step of a monoatomic layer, but faces to a serious problem with lattice defect. Particularly, the double heterostructure grown on the (100) plane of the GaAs allows the InGaAs strained active layer and interface between the active layer and the potential barrier layer overlying the active layer to include vacant lattice alignments. It is difficult to obtain a reliability of the laser device against a long time current flow.

Another one of the typical strained layer InGaAs quantum well laser is disclosed in 1991 EEE Photonics Technology Letters vol. 3, No. 5 pp. 406–408. A strained layer InGaAs quantum well laser is formed on a (100) off plane of the GaAs substrate by use of organometallic vapor phase epitaxy in an atmospheric-pressure. This laser device falls into another one of the typical laser devices wherein the substrate has a (100) off plane.

This laser device formed on a GaAs substrate having a 2° off (100) plane toward (011) direction will be described with reference to FIG. 2. An n-type 2° off (100) GaAs substrate 41 is prepared on which an n-type GaAs buffer layer 42 having a thickness of 0.5 micrometers is formed. An n-type $Al_{0.4}Ga_{0.6}As$ cladding layer 43 having a thickness of 1 micrometer is grown on the n-type GaAs buffer layer 42. An $Al_xGa_{1-x}As$ graded-index optical confinement layer 44 having a thickness of 0.15 micrometers is grown on the $Al_{0.4}Ga_{0.6}As$ cladding layer 43. An active region 45 is grown on the $Al_xGa_{1-x}As$ graded-index optical confinement layer 44. The active region 45 comprises alternative laminations of four GaAs potential barrier layers having a thickness of 12 nanometers and three $In_{0.2}Ga_{0.8}As$ strained layer quantum wells having a thickness of 7 nanometers. An $Al_xGa_{1-x}As$ graded-index optical confinement layer 46 having a thickness of 0.15 micrometers is grown on the active region 45. A p-type $Al_{0.4}Ga_{0.6}As$ cladding layer 47 having a thickness of 1 micrometer is grown on the $Al_xGa_{1-x}As$ graded-index optical confinement layer 46. A p-type GaAs cap layer 48 is grown on the p-type $Al_{0.4}Ga_{0.6}As$ cladding layer 47 to thereby form a wafer including the double heterostructure for subsequent formation of a ridge waveguide, resulting in a formation of the strained Layer quantum well semiconductor laser. The laser obtained shows a laser emission at a wavelength of 0.98 micrometers.

The above type of the laser device wherein the double heterostructure is formed on the 2° off (100) plane of the GaAs substrate has a problem with a high threshold current and also a wide full width at half maximum of photoluminescence as well as problem with shifting a photoluminescence peak wavelength toward a short wavelength.

SUMMARY OF THE INVENTION

Accordingly, it is a general object of the present invention to provide a novel strained layer InGaAs quantum well semiconductor laser device on a GaAs substrate free from any problems as described above.

It is an object of the present invention to provide a novel strained layer InGaAs quantum well semiconductor laser device on a GaAs substrate being capable of exhibiting high performances and possessing excellent properties.

It is a further object of the present invention to provide a novel semiconductor laser device on a GaAs substrate, including a strained layer InGaAs quantum well free from any lattice defects or any crystal defects.

It is a still further object of the present invention to provide a novel semiconductor laser device on a GaAs substrate, including a lattice defect free interface between a strained layer InGaAs quantum well and a barrier layer grown on the quantum well.

It is yet a further object of the present invention to provide a novel semiconductor laser device on a GaAs substrate, including a sufficiently flat interface between a strained layer InGaAs quantum well and a barrier layer grown on the quantum well.

It is a furthermore object of the present invention to provide a novel strained layer InGaAs quantum well semiconductor laser device on a GaAs substrate, being free from any shifting a photoluminescence peak wavelength toward a short wavelength.

It is a moreover object of the present invention to provide a novel strained layer InGaAs quantum well semiconductor laser device on a GaAs substrate, possessing a low threshold current property.

It is another object of the present invention to provide a novel strained layer InGaAs quantum well semiconductor laser device on a GaAs substrate, possessing a narrow full width at half maximum of photoluminescence.

It is another object of the present invention to provide a novel strained layer InGaAs quantum well semiconductor laser device on a GaAs substrate, possessing a secure reliability for long time operation.

The above and other objects, features and advantages of the present invention will be apparent from the following descriptions.

The present invention provides a semiconductor double heterostructure being formed on a GaAs substrate having an off (100) plane slightly tilted toward a predetermined direction, the double heterostructure including an InGaAs quantum well active strained layer sandwiched between potential barrier layers and including an interface between the InGaAs quantum well active strained layer and an upper potential barrier layer grown on the active strained layer, wherein the interface has a periodical ridge-like bunching structure comprising quadrilateral waveform parts and triangular waveform parts, each of the quadrilateral waveform parts comprises a series of a bottom terrace of the just (100) plane, a reverse direction multiple step plane largely tilted from (100) direction toward the opposite direction to the predetermined direction, a top terrace of the just (100) plane and a forward direction multiple step plane largely tilted from (100) direction toward the predetermined direction, each of the triangular waveform parts comprises the just (100) plane terrace and the forward direction multiple step plane largely tilted from (100) direction toward the predetermined direction. The quadrilateral waveform parts occupy at least a half or more of the interface between the InGaAs quantum well active strained layer and the upper potential barrier layer.

The GaAs substrate may be tilted by an angle in the range of from 0.5° to 1° from (100) plane toward (0 1 −1) direction. The barrier layer comprises a GaAs layer. The double heterostructure is grown by an organometallic vapor phase epitaxy in an atmospheric pressure.

The present invention also provides a semiconductor double heterostructure being formed on a GaAs substrate having an off (100) plane slightly tilted toward a predetermined direction, the double heterostructure including a plurality of InGaAs quantum well active strained layers, each of the InGaAs quantum well active strained layers being sandwiched between potential barrier layers and the double heterostructure including interfaces, each of which is defined between the InGaAs quantum well active strained layer and an upper potential barrier layer grown on the active strained layer, wherein each of the interfaces has a periodical ridge-like bunching structure comprising quadrilateral waveform parts and triangular waveform parts, each of the quadrilateral waveform parts comprises a series of a bottom terrace of the just (100) plane, a reverse direction multiple step plane largely tilted from (100) direction toward the opposite direction to the predetermined direction, a top terrace of the just (100) plane and a forward direction multiple step plane largely tilted from (100) direction toward the predetermined direction, each of the triangular waveform parts comprises the just (100) plane terrace and the forward direction multiple step plane largely tilted from (100) direction toward the predetermined direction.

The present invention also provides a semiconductor laser comprising a wafer being formed on a GaAs substrate having an off (100) plane slightly tilted toward a predetermined direction and ridge waveguides formed on the wafer, the wafer having a double heterostructure including an InGaAs quantum well active strained layer sandwiched between potential barrier layers and including an interface between the InGaAs quantum well active strained layer and an upper potential barrier layer grown on the active strained layer, wherein the interface has a periodical ridge-like bunching structure comprising quadrilateral waveform parts and triangular waveform parts, each of the quadrilateral waveform parts comprises a series of a bottom terrace of the just (100) plane, a reverse direction multiple step plane largely tilted from (100) direction toward the opposite direction to the predetermined direction, a top terrace of the just (100) plane and a forward direction multiple step plane largely tilted from (100) direction toward the predetermined direction, each of the triangular waveform parts comprises the just (100) plane terrace and the forward direction multiple step plane largely tilted from (100) direction toward the predetermined direction.

The present invention also provides a semiconductor laser comprising a wafer being formed on a GaAs substrate having an off (100) plane slightly tilted toward a predetermined direction and ridge waveguides formed on the wafer, the wafer having a double heterostructure including a plurality of InGaAs quantum well active strained layers, each of the InGaAs quantum well active strained layers being sandwiched between potential barrier layers and the double heterostructure including interfaces, each of which is defined between the InGaAs quantum well active strained layer and an upper potential barrier layer grown on the active strained layer, wherein the interface has a periodical ridge-like bunching structure comprising quadrilateral waveform parts and triangular waveform parts, each of the quadrilateral waveform parts comprises a series of a bottom terrace of the just (100) plane, a reverse direction multiple step plane largely tilted from (100) direction toward the opposite direction to the predetermined direction, a top terrace of the just (100) plane and a forward direction multiple step plane largely tilted from (100) direction toward the predetermined direction, each of the triangular waveform parts comprises the just (100) plane terrace and the forward direction multiple step plane largely tilted from (100) direction toward the predetermined direction.

BRIEF DESCRIPTIONS OF THE DRAWINGS

Preferred embodiments of the present invention will hereinafter fully be described in detail with reference to the accompanying drawings.

FIG. 1 is a fragmentary cross sectional elevation view illustrative of the conventional strained layer InGaAs quantum well semiconductor laser formed on the just (100) plane of the GaAs substrate.

FIG. 2 is a fragmentary cross sectional elevation view illustrative of the another conventional strained layer InGaAs quantum well semiconductor laser formed on the 2° off (100) plane GaAs substrate.

FIG. 3 is a view illustrative of a sectional structure of an interface defined between a quantum well InGaAs strained layer and an upper GaAs barrier layer overlying on the strained layer involved in a double heterostructure on a (100) plane tilted by 0.5° toward (0 1 −1) direction of the GaAs substrate according to the present invention.

Figure 6:
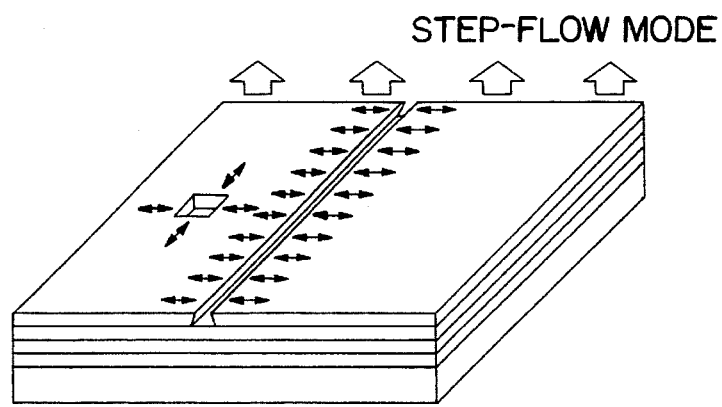
Figure 7:
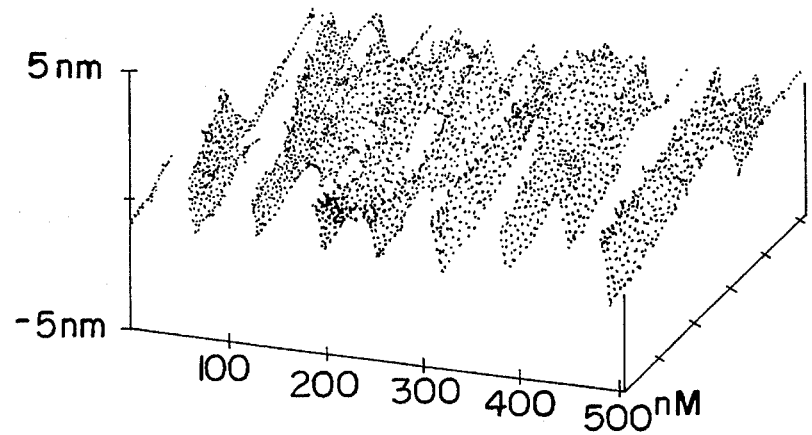

FIG. 6 is a view illustrative of layer-by-layer growth in step flow mode of an InGaAs strained layer when the InGaAs strained layer grown on a (100) plane tilted by an angle not more than 0.1° toward (0 1 −1) direction of the GaAs substrate. FIG. 7 is a view illustrative of a growth surface of an InGaAs strained layer grown on a (100) plane tilted by 2.5° toward (0 1 −1) direction at a position of the convex portion of the GaAs substrate.

Figure 8:
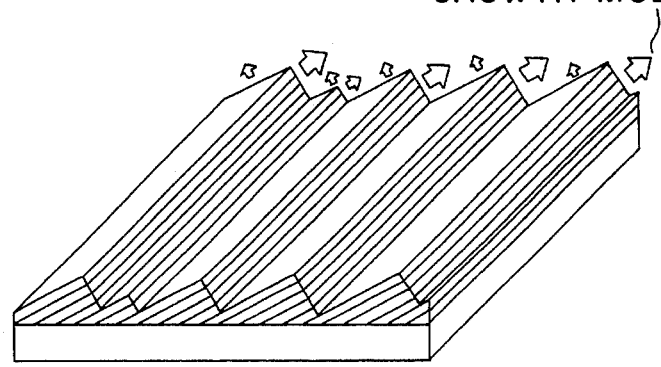

FIG. 8 is a view illustrative of a high density bunching growth in multiple step plane growth mode of an InGaAs strained layer when the InGaAs strained layer grown on a (100) plane tilted by an angle not more than 2.5° toward (0 1 −1) direction of the GaAs substrate.

Figure 9:
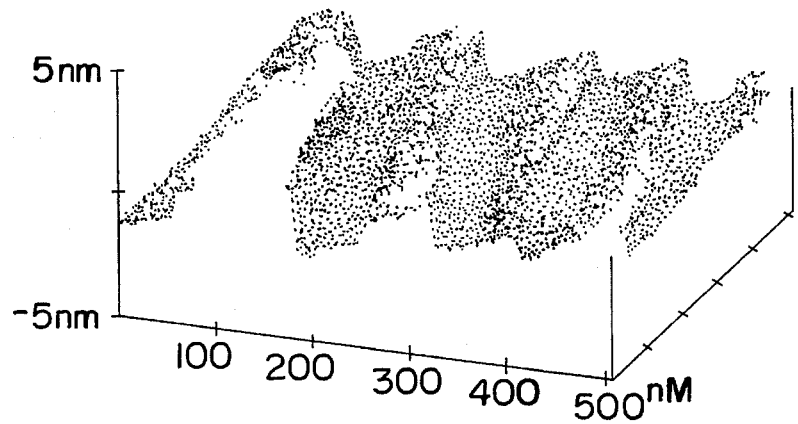

FIG. 9 is a view illustrative of a growth surface of an InGaAs strained layer grown on a (100) plane tilted by 0.7° toward (0 1 −1) direction at a position of the convex portion of the GaAs substrate.

Figure 10:
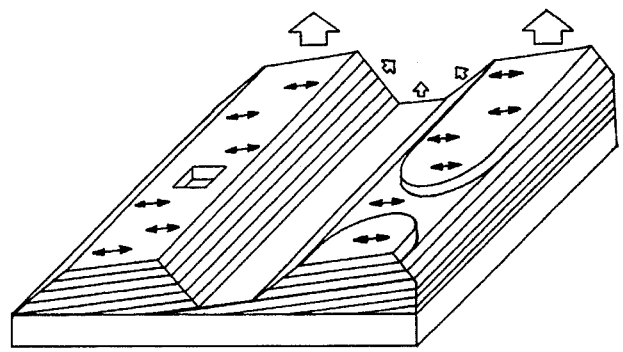

FIG. 10 is a view illustrative of a low density periodical ridge-like bunching growth in restricted step flow mode of an InGaAs strained layer when the InGaAs strained layer grown on a (100) plane tilted by an angle not more than 0.7° toward (0 1 −1) direction of the GaAs substrate.

Figure 11:
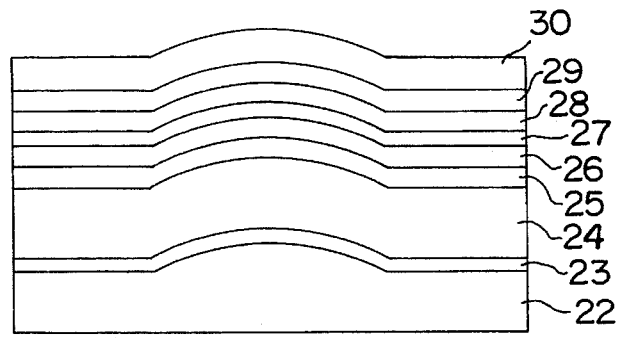

FIG. 11 is a cross sectional elevation view illustrative of a wafer including an InGaAs strained layer on a GaAs substrate with a sperical convex portion for photoluminescence measurement.

Figure 12:
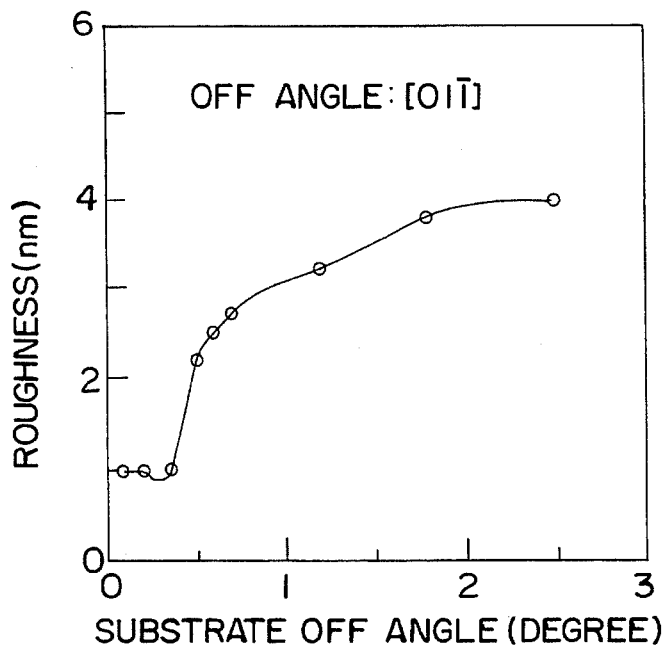

FIG. 12 is a diagram illustrative of a dependency of a surface roughness of an InGaAs strained layer upon a substrate off angle.

Figure 13:
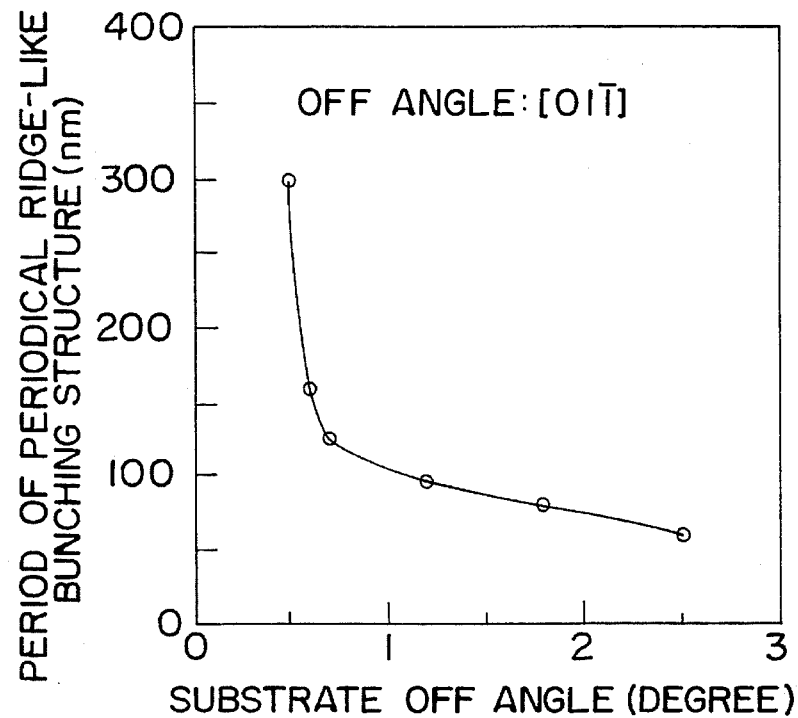

FIG. 13 is a diagram illustrative of a dependency of a period of periodical ridge-like bunching structure of an InGaAs strained layer upon a substrate off angle.

Figure 14:
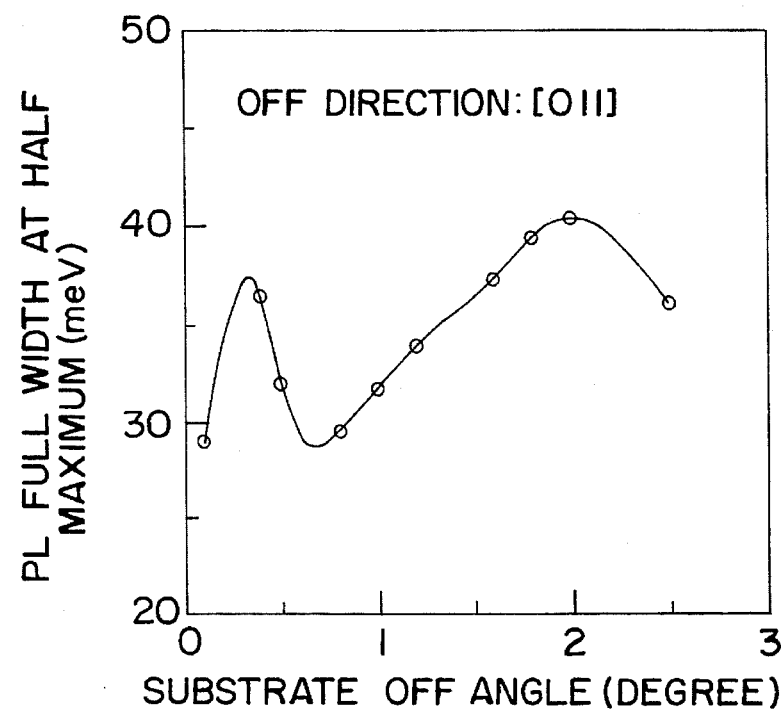

FIG. 14 is a diagram illustrative of a dependency of a photoluminescence full width at half maximum of a laser upon a substrate off angle.

Figure 15:
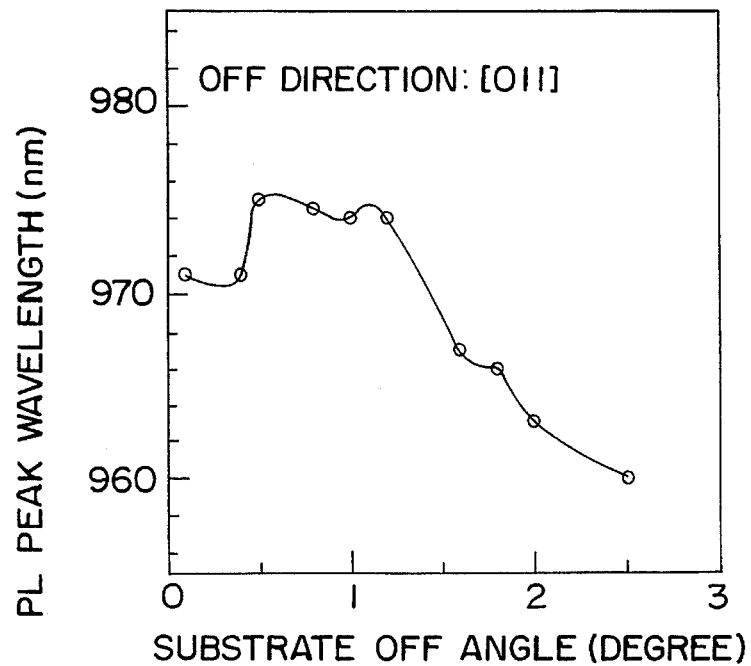

FIG. 15 is a diagram illustrative of a dependency of a photoluminescence peak wavelength of a laser upon a substrate off angle.

Figure 16:
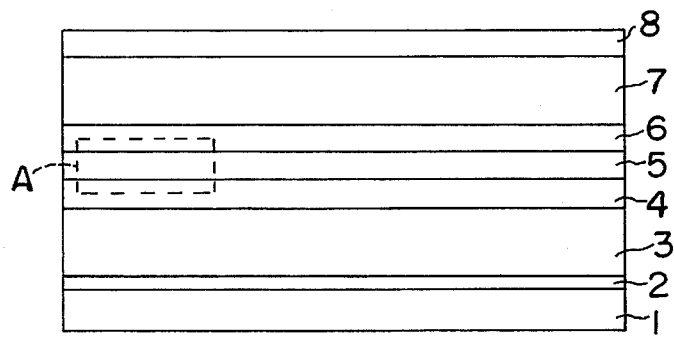

FIG. 16 is a cross sectional elevation view illustrative of a wafer including a double heterostructure involving a quantum well InGaAs strained layer sandwiched between GaAs barrier layers formed over a GaAs substrate with a (100) plane tilted by a predetermined angle according to the present invention.

Figure 17:
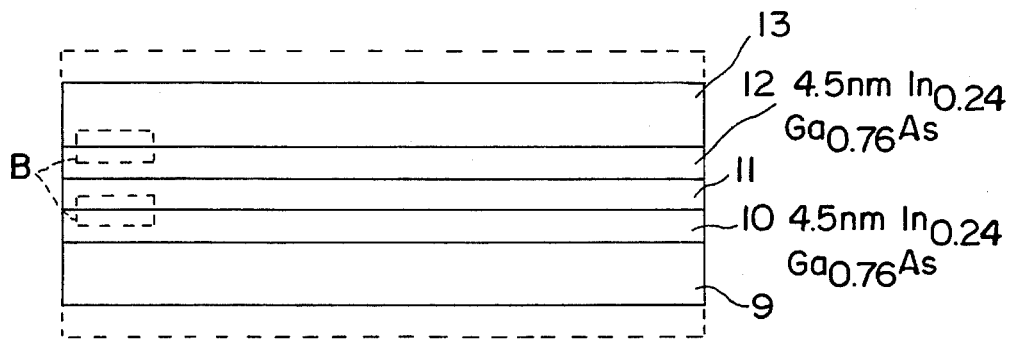

FIG. 17 is an enlarged cross sectional elevation view of an area "A" enclosed by dotted lines in FIG. 16 and being illustrative of the double heterostructure involving a quantum well InGaAs strained layer sandwiched between GaAs barrier layers according to the present invention.

Figure 18:
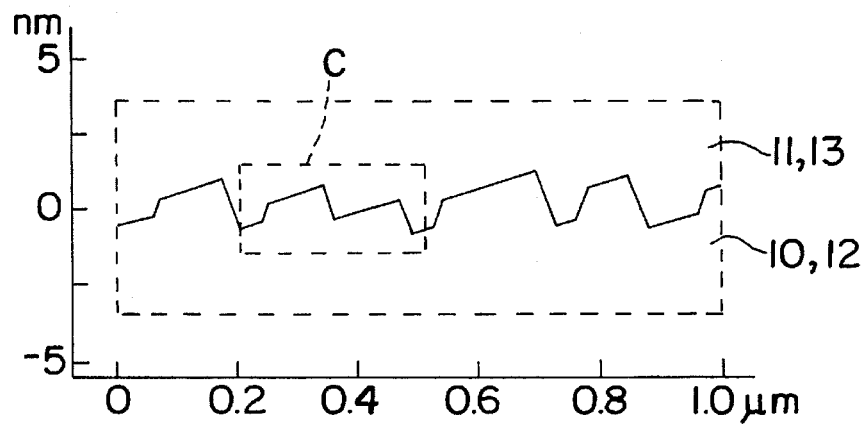

FIG. 18 is an enlarged cross sectional elevation view of areas "B" enclosed by dotted lines in FIG. 17 and being illustrative of a sectional structure of the interface defined between a quantum well InGaAs strained layer and an upper GaAs barrier layer overlying on the strained layer involved in a double heterostructure on a (100) plane tilted by 0.5° toward (0 1 −1) direction of the GaAs substrate according to the present invention.

Figure 19:
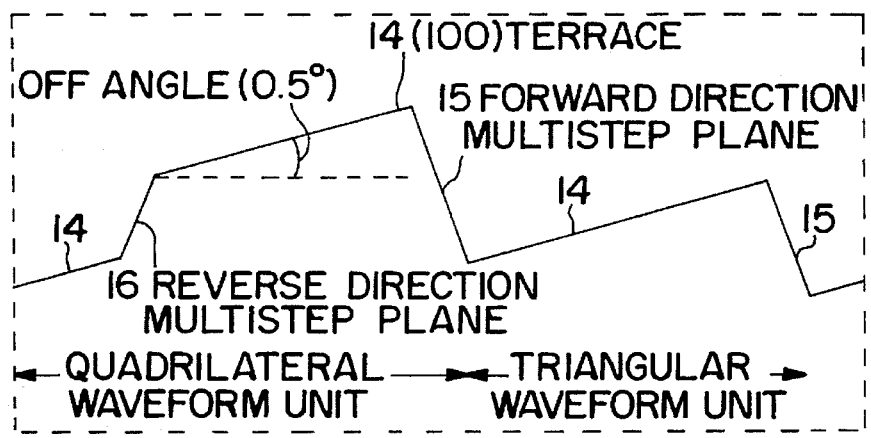

FIG. 19 is an enlarged cross sectional elevation view of areas "C" enclosed by dotted lines in FIG. 18 and being illustrative of a partial sectional structure of the interface of FIG. 18.

Figure 20:
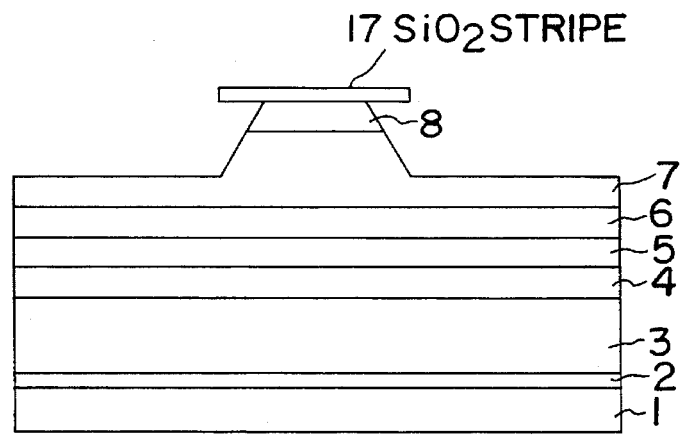

FIG. 20 is a cross sectional elevation view illustrative of the wafer of FIG. 8 being formed thereon with a mesa stripe along (0 1 −1) direction.

Figure 21:
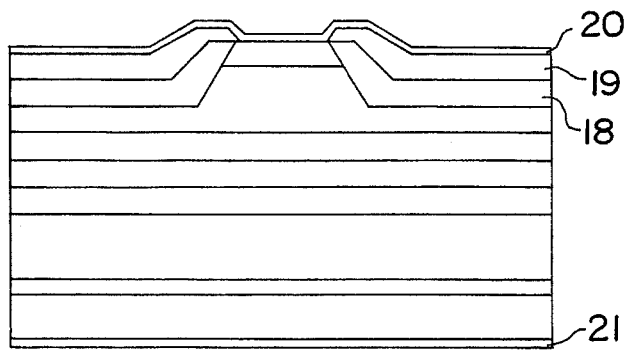

FIG. 21 is a cross sectional elevation view illustrative of a strained layer InGaAs quantum well lateral mode control semiconductor laser according to the present invention.

Figure 22:
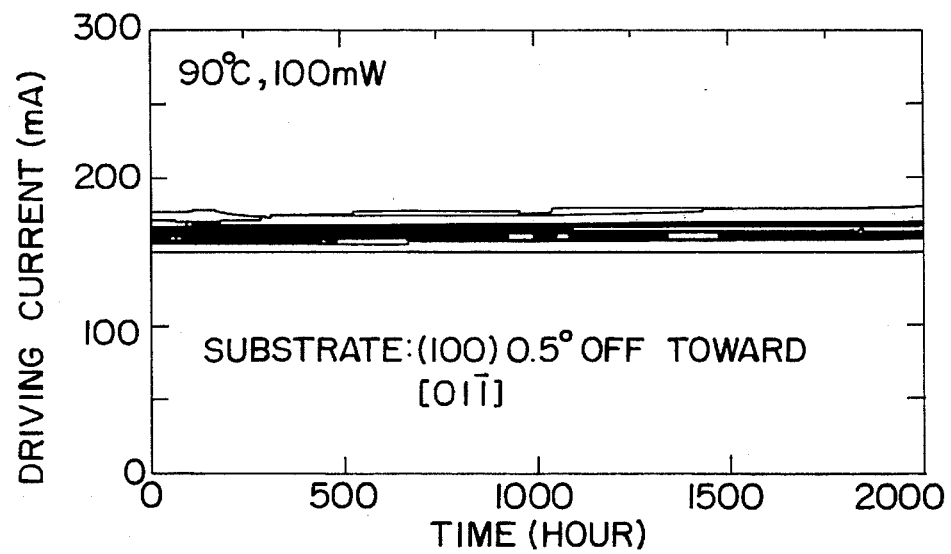

FIG. 22 is a diagram illustrative of a dependency of driving current property upon constant output power aging according to the present invention.

Figure 23:
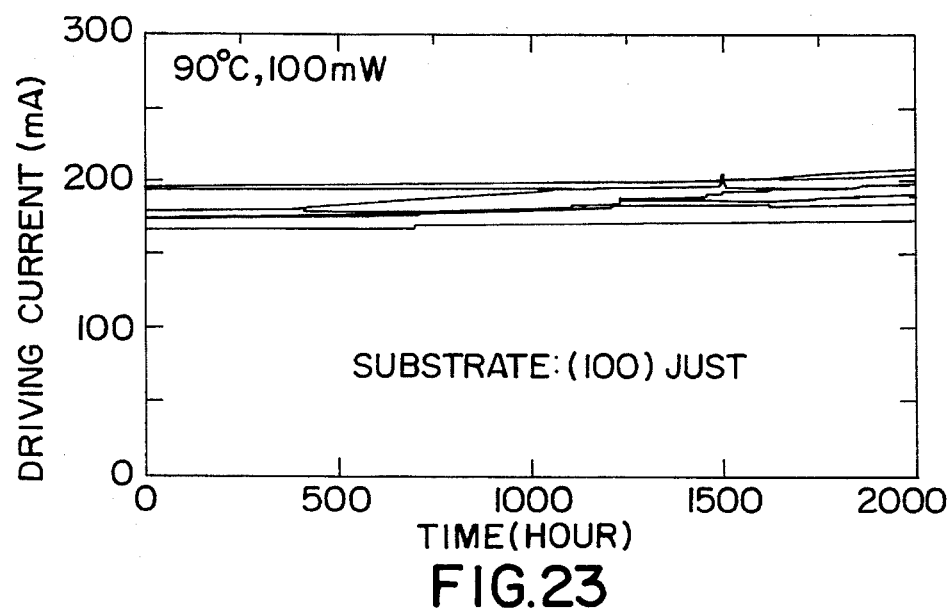

FIG. 23 is a diagram illustrative of a dependency of driving current property upon constant output power aging in a comparative example.

DESCRIPTIONS OF THE INVENTION

The present invention provides a semiconductor double heterostructure being formed on a GaAs substrate having an off (100) plane slightly tilted toward a predetermined direction. The double heterostructure includes an InGaAs quantum well active strained layer sandwiched between potential barrier layers and includes an interface between the InGaAs quantum well active strained layer and an upper potential barrier layer grown on the active strained layer. It is very important for the present invention that as illustrated in FIG. 3 the interface has a periodical ridge-like bunching structure comprising quadrilateral waveform parts and triangular waveform parts. Each of the quadrilateral waveform parts comprises a series of a bottom terrace of the just (100) plane, a reverse direction multiple step plane largely tilted from (100) direction toward the opposite direction to the predetermined direction, a top terrace of the just (100) plane and a forward direction multiple step plane largely tilted from (100) direction toward the predetermined direction. Each of the triangular waveform parts comprises the just (100) plane terrace and the forward direction multiple step plane largely tilted from (100) direction toward the predetermined direction.

The quadrilateral waveform parts occupy at least a half or more of the interface between the InGaAs quantum well active strained layer and the upper potential barrier layer. The GaAs substrate may be tilted by an angle in the range of from 0.5° to 1° from (100) plane toward (0 1 −1) direction. The barrier layer comprises a GaAs layer. The double heterostructure is grown by an organometallic vapor phase epitaxy in an atmospheric pressure.

The present invention also provides a semiconductor double heterostructure being formed on a GaAs substrate having an off (100) plane slightly tilted toward a predetermined direction. The double heterostructure including a plurality of InGaAs quantum well active strained layers. Each of the InGaAs quantum well active strained layers is sandwiched between potential barrier layers. The double heterostructure includes interfaces, each of which is defined between the InGaAs quantum well active strained layer and an upper potential barrier layer grown on the active strained layer. It is very important that as illustrated in FIG. 3 each of the interfaces has a periodical ridge-like bunching structure comprising quadrilateral waveform parts and triangular waveform parts. Each of the quadrilateral waveform parts comprises a series of a bottom terrace of the just (100) plane, a reverse direction multiple step plane largely tilted from (100) direction toward the opposite direction to the predetermined direction, a top terrace of the just (100) plane and a forward direction multiple step plane largely tilted from (100) direction toward the predetermined direction. Each of the triangular waveform parts comprises the just (100) plane terrace and the forward direction multiple step plane largely tilted from (100) direction toward the predetermined direction.

The present invention also provides a semiconductor laser comprising a wafer being formed on a GaAs substrate having an off (100) plane slightly tilted toward a predetermined direction and ridge waveguides formed on the wafer. The wafer has a double heterostructure including an InGaAs quantum well active strained layer sandwiched between potential barrier layers and including an interface between the InGaAs quantum well active strained layer and an upper potential barrier layer grown on the active strained layer. It is very important that as illustrated in FIG. 3 the interface has a periodical ridge-like bunching structure comprising quadrilateral waveform parts and triangular waveform parts. Each of the quadrilateral waveform parts comprises a series of a bottom terrace of the just (100) plane, a reverse direction multiple step plane largely tilted from (100) direction toward the opposite direction to the predetermined direction, a top terrace of the just (100) plane and a forward direction multiple step plane largely tilted from (100) direction toward the predetermined direction. Each of the triangular waveform parts comprises the just (100) plane terrace and the forward direction multiple step plane largely tilted from (100) direction toward the predetermined direction.

The present invention also provides a semiconductor laser comprising a wafer being formed on a GaAs substrate having an off (100) plane slightly tilted toward a predetermined direction and ridge waveguides formed on the wafer. The wafer has a double heterostructure including a plurality of InGaAs quantum well active strained layers. Each of the InGaAs quantum well active strained Layers being sandwiched between potential barrier layers and the double heterostructure including interfaces, each of which is defined between the InGaAs quantum well active strained layer and an upper potential barrier layer grown on the active strained layer It is very important that as illustrated in FIG. 3 the interface has a periodical ridge-like bunching structure comprising quadrilateral waveform parts and triangular waveform parts, each of the quadrilateral waveform arts comprises a series of a bottom terrace of the just (100) plane, a reverse direction multiple step plane largely tilted from (100) direction toward the opposite direction to the predetermined direction, a top terrace of the just (100) plane and a forward direction multiple step plane largely tilted from (100) direction toward the predetermined direction. Each of the triangular waveform parts comprises the just (100) plane terrace and the forward direction multiple step plane largely tilted from (100) direction toward the predetermined direction.

According to the present invention, there is provided the strained layer InGaAs quantum well semiconductor laser device on a GaAs substrate capable for achieving the objects of the inventions mentioned in the above. Namely, the strained layer InGaAs quantum well semiconductor laser device on a GaAs substrate is capable of exhibiting high performances and possessing excellent properties. The semiconductor laser device on a GaAs substrate includes a strained layer InGaAs quantum well free from any lattice defects or any crystal defects. The semiconductor laser device on a GaAs substrate includes a lattice defect free interface defined between a strained layer InGaAs quantum well and a barrier layer grown on the quantum well. The semiconductor laser device on a GaAs substrate, includes a sufficiently flat interface between a strained layer InGaAs quantum well and a barrier layer grown on the quantum well. The strained layer InGaAs quantum well semiconductor laser device on a GaAs substrate is free from any shifting a photoluminescence peak wavelength toward a short wavelength. The strained layer InGaAs quantum well semiconductor laser device on a GaAs substrate possesses a low threshold current property. The strained layer InGaAs quantum well semiconductor laser device on a GaAs substrate possesses a narrow full width at half maximum of photoluminescence. The strained layer InGaAs quantum well semiconductor laser device on a GaAs substrate possesses a secure reliability for long time operation.

The above advantages may be obtained by the characteristic interface defined between the active quantum well layer and the upper potential barrier layer grown on the active layer. The above characteristic interface could be obtained by consideration and study for the growth mechanism of InGaAs strained layer to be grown on the GaAs barrier layer over the GaAs substrate having (100) plane tilted toward a predetermined direction, for example, (0 1 −1) direction by various angles. The growth of the InGaAs strained layer serving as the quantum well active layer on the GaAs potential barrier layer depends upon the tilted angle of the (100) plane toward the (0 1 −1) direction of the GaAs substrate. Accordingly, the following descriptions will focus on the growth mechanism in growing the InGaAs strained layer on the GaAs potential barrier layer over the GaAs substrate having the (100) plane tilted toward the (0 1 −1) direction by various angles with reference to the drawings.

To investigate the dependency of a growth surface of the InGaAs strained layer, a specific wafer as illustrated in FIG.

4 was prepared. A GaAs substrate 22 has a (100) plane provided at its center portion with a spherical convex formed by photolithography and wet etching. The spherical convex has such a constant curvature that an off angle is changed from 0° at a top of the spherical convent to about 2° at a sloped portion having a distance of 40 micrometers from the top wherein the off angle is defined by the (100) plane and the tangential line. On the GaAs substrate with the spherical convex, a non-doped GaAs buffer layer 23 having a thickness of 0.5 micrometers and a non-doped $Al_{0.4}Ga_{0.6}As$ cladding layer 24 having a thickness of 2 micrometers are in turn grown on the entire surface of the GaAs substrate 22 by use of a metal organic vapor phase epitaxy in an atmospheric pressure at a growth temperature of 760° C. at a ratio of 80 in partial pressure of a group V source to a group III source. Further, an $Al_{0.2}Ga_{0.8}As$ optical guide layer 25 having a thickness of 40 nanometers was then grown on the non-doped $Al_{0.4}Ga_{0.6}As$ cladding layer 24 by the metal organic vapor phase epitaxy in the atmospheric pressure, provided that the growth temperature of 760° C. is dropped to 610° C. Subsequently, a non-doped GaAs barrier layer 26 having a thickness of 20 nanometers and a non-doped $In_{0.24}Ga_{0.76}As$ strained layer 27 having a thickness of 4.5 nanometers were in turn grown by use of the metal organic vapor phase epitaxy in the atmospheric pressure at a growth temperature of 610° C. at a ratio of 20 in partial pressure of a group V source to a group III source. Thereafter, the substrate temperature was dropped to 400° C. or less within 3 minutes after the growth of the $In_{0.24}Ga_{0.76}As$ strained layer 27 was completed. Top surface of the $In_{0.24}Ga_{0.76}As$ strained layer 27 over the sperical convex of the GaAs substrate was observed by use of inter-atomic microscope.

Figure 5:
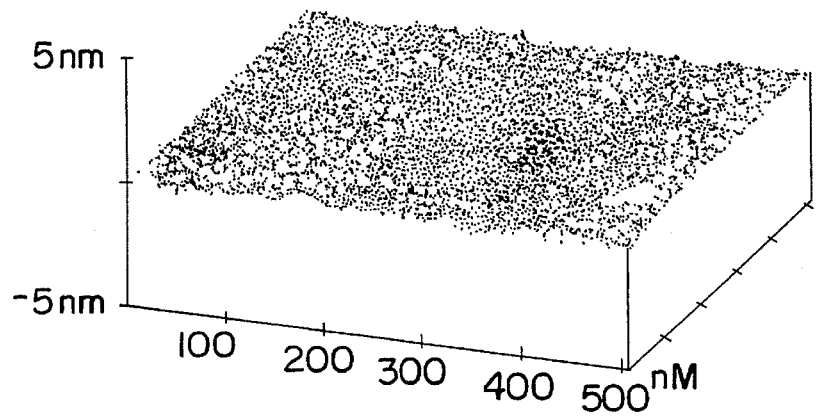
FIG. 5 is a view illustrative of a growth surface of an InGaAs strained layer grown on a (100) plane tilted by 0.1° toward (0 1 −1) direction at a position of the convex portion of the GaAs substrate.

FIG. 5 illustrates a surface of the $In_{0.24}Ga_{0.76}As$ strained layer 27 on a (100) plane tilted by 0.1" toward (0 1 −1) over the GaAs substrate 22. Step lines appear on the surface of the $In_{0.24}Ga_{0.76}As$ strained layer 27. The step is one of a monoatomic layer. This means that a step flow growth appears wherein the growth is made in layer by layer in the level of monoatomic layer. Namely, at a time the growth of a single monoatomic layer appears. FIG. 6 illustrates a layer by layer growth in the step flow mode. A distance between adjacent steps is kept sufficiently wide so that a good flatness of the strained layer is kept during the growth. Lattice structure on a top surface of the strained layer is uniformly strained through the entire surface thereof. This allows that any steps which appear on the surface to accept introduction of a growth seed at the uniform propagation. This further facilitates the promotion of the layer by layer growth. This layer by layer growth in the step flow mode, however, has the following disadvantage.

In the growth of the strained layer, a small step density and a good flatness obtained tends to allow facilitated introduction of unnecessary lattice defects or crystal defects. The monoatomic layers are laminated in layer by layer together with receiving a stress in a growth plane due to a difference in the lattice constant between InGaAs and GaAs, however, the top monoatomic layer only may be permitted to have a relaxation of the strain. In FIG. 6, small arrow marks indicate a direction of the relaxation of the stress of the top monoatomic layer. The strained lattice constant is released into a non-strained lattice constant larger than the strained lattice constant. The strain relaxation appears edges on the terrace. If an atomic vacancy appears on the terrace to thereby form an atomic scale aperture, then the strain relaxation appears around the atomic scale aperture due to the atomic vacancy, resulting in a minimization of the atomic scale aperture so that it is no longer possible to allow an atom to enter into the minimized aperture. This means that when the atomic vacancy once appears then it is difficult to repair the atomic scale aperture due to the lattice vacancy, resulting in that the lattice vacancy remains without repaired. Further, the strain relaxation appears on an edge line of the terrace so that a top portion of the edge plane of the layer being on the step flow growth extends to beyond over a bottom portion of the edge plane. This results in that when the edge lines of the adjacent two terraces being on the step flow growth hit to each other then the top portions of the edge planes thereof hit to each other but the bottom portions thereof never contact with each other and thereby a vacant lattice alignment is formed along the edge lines thereof. The atomic vacancy and the aligned lattice vacancy results in a considerable deterioration of the quality in crystal of the strained layer. The strained layer including a large number of atomic vacancies and lattice vacancies has none of any excellent quality thereby preventing the laser including the strained layer as a quantum well active layer to show any excellent performances.

Figure 4:
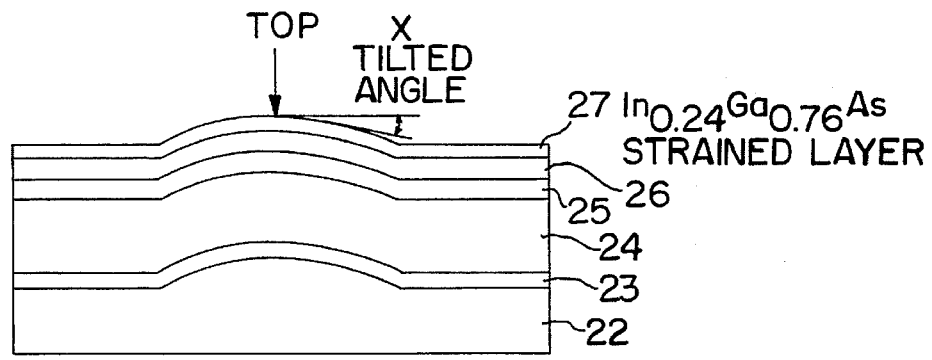
FIG. 4 is a cross sectional elevation view illustrative of a wafer including a top InGaAs strained layer on a GaAs substrate with a sperical convex portion.

FIG. 7 illustrates a surface of the $In_{0.24}Ga_{0.76}As$ strained layer 27 on a (100) plane tilted by 2.5° toward (0 1 −1) over the GaAs substrate 22 illustrated in FIG. 4. It was confirmed by use of interatomic microscope that periodical triangle waveforms appear on the surface of the $In_{0.24}Ga_{0.76}As$ strained layer 27. The periodical triangle waveform is formed of a plurality of periods comprising a terrace having a just (100) plane with zero off angle and a forward direction multiple step plane largely tilted from (100) direction toward (0 1 −1) direction. The multiple step plane comprises a plurality of laminated monoatomic layer step. The periodical triangle waveform comprising the just (100) terraces and the multiple steps is caused by a step bunching growth. However, none of the layer by layer growth in the step flow mode appears. The step bunching growth mechanism in the multiple step growth mode completely differs from the layer by layer growth in the step flow mode.

FIG. 8 illustrates the step bunching growth in the multiple step plane growth mode. A distance between adjacent steps is kept small so that no flatness of the strained layer is kept during the growth. The step bunching and the multiple step plane comprises a plurality of monoatomic layers wherein the steps lines of the monoatomic layers are concentrated and laminated in an upper direction with a tilted angle. When an off angle or the tilted angle of 2.5° from the (100) plane of the GaAs substrate is selected, then in an initial growth, the layer by layer growth appears. An averaged distance between steps of InGaAs monoatomic layers is 6 nanometers and a diffusion distance of the growth seed is 50 nanometers or more which is considerably larger than the averaged distance between the monoatomic layer steps. Thus, a density of the monoatomic layer steps has a fluctuation in the scale of the diffusion distance of the growth seeds. Namely, the density of the monoatomic layer steps is variable to have a fluctuation in the scale of the diffusion distance of the growth seeds. High and low step densities are caused. The thicknesses of the strained layers are variable in forward and reverse sides of the high step density portion wherein a plurality of step planes of the monoatomic layers face toward the forward side and the reverse side is the opposite side to the forward side. For example, the thickness of the strained layer is small in the forward side of the high step density portion, but large in the reverse side. This results in a fluctuation in the thickness of the strained monoatomic layer. The thick part of the strained layer has a small or relaxed compressive strain as compared to a compressive strain possessed by the thin part of the strained layer. This means that the strained layer in the reverse side of the high step density portion has a small or relaxed compressive strain as compared to the strained layer in the forward side of the high step density portion. The fluctuation in the thickness of the strained monoatomic layers being on the growth results in a corresponding fluctuation in the compressive strain distribution of the strained layer. InGaAs has a larger lattice constant than a lattice constant of GaAs. The InGaAs strained layer having the fluctuation or variation in the compressive strain distribution shows fluctuated or varied growth rates. For example, the small or relaxed strain allows for a high growth rate of the InGaAs strained layer, while the large strain provides a low growth rate of the InGaAs strained layer. This results in that the small or relaxed strain part of the InGaAs strained layer in the forward side to the high step density part shows a higher growth rate as compared to a growth rate of the large strain part of the InGaAs strained layer in the reverse side to the high step density part. The forward side part of the strained layer is positioned below the high density multiple steps, while the reverse side part of the strained layer is positioned above the high density multiple steps. Namely, the forward side part of the strained layer is a lower part of a sloped terrace, while the reverse side part of the strained layer is an upper part of an adjacent sloped terrace. This means that the upper part of the sloped terrace near to the top of the multiple step planes shows a high growth rate while the lower part of the sloped terrace near to the bottom of the multiple step planes shows a low growth rate. This results in that the slope of the (100) just terrace comes steep increasingly as the growth is progressed thereby the high step density part of the strained layers comes to have a higher density in the step distribution increasingly, while the low step density part of the strained layers comes to have a lower density in the step distribution increasingly. This growth mechanism may form steeper multiple steps laminated to define a steeper and larger multiple step plane. As the formation of the steep multiple step plane is progressed, then the layer by layer growth step slightly appears but which appears in the initial growth stage.

The multiple step plane constituted by the laminated monoatomic layer steps is once formed and then the growth mode comes into the multiple step plane growth mode in which the multiple step plane is significantly grown in a vertical direction to the multiple step plane, while the (100) just terrace is slightly grown toward the upper direction vertical to the (100) plane as indicated by a small arrow mark in FIG. 8. In the multiple step plane growth mode, the triangular waveform is well kept. For the growth of the multiple step plane, a growth of a bottom layer having a large compressive strain toward the vertical direction to the multiple step plane is followed by a growth of an upper layer having a smaller compressive strain. Namely, the growth of the upper layer having a higher growth rate tends to beyond the growth of the bottom layer having a lower growth rate. This results in an introduction of aligned lattice vacancy along the bottom portion of the multiple step plane. This periodical triangular waveform in a relatively short period provides such a quantum line effect as shifting photoluminescence peak wavelength into a short wavelength. The period of the triangular waveform is variable but never uniform, thereby resulting in a broadening of the full width at half maximum of photoluminescence spectrum.

FIG. 9 illustrates a surface of the $In_{0.24}Ga_{0.76}As$ strained layer 27 on a (100) plane tilted by 0.5° toward (0 1 −1) over the GaAs substrate 22 illustrated in FIG. 4. It was confirmed by use of interatomic microscope that periodical ridge-like bunching structure comprising quadrilateral waveform parts and triangle waveform parts appear on the surface of the $In_{0.24}Ga_{0.76}As$ strained layer 27. The quadrilateral waveform part comprises a series of a bottom terrace of the just (100) plane, a reverse direction multiple step plane largely tilted from (100) direction toward the opposite direction to the (0 1 −1) direction, a top terrace of the just (100) plane and a forward direction multiple step plane largely tilted from (100) direction toward the (0 1 −1) direction. The triangle waveform part comprises the just (100) plane terrace and the forward direction multiple step plane largely tilted from (100) direction toward (0 1 −1) direction. The multiple step plane comprises a plurality of laminated monoatomic layer step. The triangle waveform parts comprising the just (100) terraces and the multiple steps is caused by the step bunching growth in the multiple step plane growth mode. However, the triangle waveform parts are minority and the quadrilateral waveform parts occupy the majority of the entire ridge-like bunching portions.

FIG. 10 illustrates the restricted region step flow mode. When an off angle or the tilted angle of 0.7° from the (100) plane of the GaAs substrate is selected, then in an initial growth, the layer by layer growth appears. An averaged distance between steps of InGaAs monoatomic layers is larger than that of the multiple step plane growth mode as described above and a diffusion distance of the growth seed is also longer than that of the multiple step plane growth mode. Thus, a density of the monoatomic layer steps is smaller than that of the multiple step plane growth mode but has a fluctuation in the scale of the diffusion distance of the growth seeds. Namely, the density of the monoatomic layer steps is small and variable to have a fluctuation in the scale of the larger diffusion distance of the growth seeds.

In this restricted region step flow mode, the distance of the terrace is relatively smaller than the averaged distance between the adjacent two terraces. Thus, the terrace is in the form of an island. Namely, in the initial growth stage, distributed islands of monoatomic strained layers are grown so that adjacent two monoatomic strained layered islands are spaced apart from each other. The strains of the isolated island-like monoatomic strained layers are relaxed since the isolated island-like monoatomic strained layers are not hit to each other thereby the relaxation of the strain appears almost on the entire of the surface but not local area. The lattice constant of the island like monoatomic layer with the relaxed strain comes into enlargement but only in the periodical direction indicated by the black arrow marks. The relaxation of the strain of the island like monoatomic layer allows a promotion of the restricted step flow but only on the island portion. The relaxation of the strain of the island like monoatomic layer also allows a higher growth rate of the islands in the step flow mode. The higher growth rate of the island further provides increase in the thickness of the growing layer on the island. The increase in the thickness of the layer on the island may further promote the relaxation of the compressive strain of the strained layer growing on the island. The relaxation of the strain of the layer on the island appears extends almost the entire of the island surface. This small or relaxed strain of the layer on the island allows a considerable reduction of a probability of holding the atomic vacancy and the assigned lattice vacancy thereby providing an almost zero lattice or crystal defect density.

FIG. 12 illustrates a relationship of the surface roughness of the InGaAs strained layer versus variable off angle from (100) plane toward (0 1 −1) direction.

FIG. 13 illustrates a relationship of the period of the periodical ridge like bunching structure of the surface of the InGaAs strained layer versus variable off angle from (100) plane toward (0 1 −1) direction.

When the off angle is smaller than 0.4°, then the InGaAs strained layer shows the layer by layer growth in the step flow mode and the roughness is kept at 1 nanometer. When the off angle is larger than 0.4°, then the step bunching growth appears. The roughness is increased from 2.2 nanometers at an off angle of 0.5° up to a saturated value of 4 nanometers at a large off angle of 2° or more.

When the off angle is less than 0.4°, then the layer by layer growth in the step flow mode appears so that the period of the periodical ridge like bunching structure is infinite since no bunching structure exists. In the range of off angle from 0.5° to 1°, the period of the periodical ridge like bunching structure is rapidly reduced from 300 nanometers to 100 nanometers. In the range of off angle from 1° to 3°, the period of the periodical ridge like bunching structure is gradually reduced from 100 nanometers to 50 nanometers. In the range of off angle from 0.5° to 1°, a relatively long period of the periodical ridge like bunching structure is obtained so that the majority of the ridge like bunches comprises islands defined by series of the reverse direction multiple step plane largely tilted from (100) direction toward the opposite direction (0 −1 1) to the (0 1 −1) direction, the just (100) terrace and the forward direction multiple step plane largely tilted from (100) direction toward the (0 1 −1) direction. The present invention is to select this range. At an off angle over 1°, the triangular waveform parts occupy the majority of the ridge like bunching islands wherein the triangular wave form part comprises periods of the (100) just terraces and the forward direction multiple step planes. As the off angle is increased, the triangular waveform parts are increased so that the roughness is also increased.

In the laser including the InGaAs strained layer having the surface of FIG. 9, a photoluminescence spectrum was observed, foe which purpose a semiconductor wafer as illustrated in FIG. 11 was prepared by further providing, on the top of the wafer illustrated in FIG. 4, three layers in turn or a GaAs barrier layer 28 having a thickness of 20 nanometers, an $Al_{0.2}Ga_{0.8}As$ optical guide layer 29 having a thickness of 40 nanometers and an $Al_{0.4}Ga_{0.6}As$ cladding layer 30 having a thickness of 0.3 micrometers. The GaAs barrier layer 28 and the $Al_{0.2}Ga_{0.8}As$ optical guide layer 29 are grown at 20 of a ratio of group V source to group III source and the $Al_{0.4}Ga_{0.6}As$ cladding layer 30 is grown at 80 of a ratio of group V source to group III source and a substrate temperature is dropped to 400° C. or less within three minutes after the wafer is completed.

FIG. 14 illustrates a dependency of the photoluminescence full width at half maximum upon the off angle and FIG. 15 illustrates a dependency of the photoluminescence peak wavelength upon the off angle. The photoluminescence full width at half maximum is minimized at an off angle of 0.75° as a center of the range of off angle from 0.5° to 1°. The photoluminescence peak wavelength is maximized at about 974 nanometers in the range of off angle from 0.5° to 1.3°. It was confirmed that the interface structure illustrated in FIG. 9 is preferable in view of photoluminescence. This results means that between the separated bunching islands layer thicknesses are uniform.

PREFERRED EMBODIMENT OF THE INVENTION

A preferred embodiment of the present invention will be described in which a strained layer InGaAs quantum well laser is provided. FIG. 16 illustrates a wafer including a double heterostructure including an strained layer InGaAs quantum well involved in a laser. The wafer illustrated in FIG. 16 may be grown by use of metal organic vapor phase epitaxy in an atmospheric pressure. A Si-doped GaAs substrate 1 has a (100) plane tilted by 0.5° toward the (0 1 −1) direction on which a Si-doped GaAs buffer layer 2 having an impurity concentration of $1\times10$ $cm^{-3}$ and a thickness of 0.5 micrometers and a doped $Al_{0.4}Ga_{0.6}As$ cladding layer 3 having an impurity Concentration of $1\times10^{17}$ $cm^{-3}$ and a thickness of 2 micrometers are in turn grown at a growth temperature of 760° C. and a V/III ratio of 80. An $Al_{0.2}Ga_{0.8}As$ optical guide layer 4 having a thickness of 40 nanometers is grown on the cladding layer 3 during which the growth temperature is dropped to 610°. Subsequently, a double quantum well active strained layer structure 5 as illustrated FIG. 17 is grown at V/III ratio of 20. A illustrated in 17, the double quantum well active strained layer structure 5 comprises a GaAs barrier layer 9 having a thickness of 20 nanometers, an $In_{0.24}Ga_{0.76}As$ strained layer 10 having a thickness of 4.5 nanometers, a GaAs barrier layer 11 having a thickness of 5 nanometers, an $In_{0.24}Ga_{0.76}As$ strained layer 12 having a thickness of 4.5 nanometers and a GaAs barrier layer 13 having a thickness of 20 nanometers. An $Al_{0.2}Ga_{0.8}as$ optical guide layer 6 having a thickness of 40 nanometers, a Mg-doped $Al_{0.4}Ga_{0.6}As$ cladding layer 7 having an impurity concentration of $1\times10^{18}$ $cm^{-3}$ and a thickness of 1.5 micrometers and a Mg-doped GaAs cap layer 8 having an impurity concentration of $1\times10^{19}$ $cm^{-3}$ and a thickness of 1.0 micrometer are in turn grown by vapor phase epitaxy.

FIGS. 18 and 19 illustrate an interface defined between the InGaAs quantum well active strained layer 10 or 12 and an upper GaAs barrier layer 11 or 13 grown on the active strained layer 10 or 12. The interface has a periodical ridge-like bunching structure comprising quadrilateral waveform parts and triangular waveform parts. Each of the quadrilateral waveform parts comprises a series of a bottom terrace 14 of the just (100) plane, a reverse direction multiple step plane 16 largely tilted from (100) direction toward the opposite direction to the (0 1 −1) direction, a top terrace 14 of the just (100) plane and a forward direction multiple step plane 15 largely tilted from (100) direction toward the (0 1 −1) direction. Each of the triangular waveform parts comprises the just (100) plane terrace 14 and the forward direction multiple step plane 15. The quadrilateral waveform parts occupy at least a half or more of the interface between the InGaAs quantum well active strained layer and the upper potential barrier layer. As illustrated in FIG. 20, a $SiO_2$ film 17 is formed on the top of the GaAs cap layer 8 and then by a photolithography, a $SiO_2$ stripe 17 having a width of 4 micrometers in the (0 1 −1) direction. By us of a selective etching with the $SiO_2$ stripe mask, the cladding layer 7 is etched to leave a thickness of 0.3 micrometers thereof to thereby form a mesa structure. By a selective growth with the $SiO_2$ stripe mask 17, both sides of the mesa structure are covered by an Si-doped $Al_{0.6}Ga_{0.4}As$ current block layer 18 having an impurity concentration of $1\times10^{18}$ $cm^{-3}$ and a thickness of 0.8 micrometers and an Si-doped GaAs current block layer 19 having an impurity concentration of $1\times10^{18}$ $cm^{-3}$ and a thickness of 0.8 micrometers. After removal of the $SiO_2$ mask 17, a p-electrode 20 and an n-electrode 21 are formed to fabricate a lateral mode control semiconductor laser as illustrated in FIG. 21. Opposite cavity edges of the cavity with a length of 700 micrometers are coated with insulation films having reflectivities of 3% and 9% to a wavelength of 0.98 micrometer and thereafter the laser is mounted on a heat sink.

FIGS. 22 and 23 illustrate variations of driving currents in aging for the novel semiconductor laser fabricated by the above embodiment and the conventional semiconductor laser on a (100) GaAs substrate as a comparative example.

TABLE 1

|  | SCREENING Yield | 90° C., 100 mw increasing rate of driving current | 25° C., 100 mW increasing rate of driving current |
| --- | --- | --- | --- |
| Invention | 77% | $3 \times 10^{-6}$/h | $2 \times 10^{-7}$/h |
| Prior art | 41% | $4 \times 10^{-5}$/h | $2.6 \times 10^{-6}$/h |

In the reliability test, through the screening at 150° C., 150 mA, 100 hours, if an increase of a current necessary for 25° C. and 100 mW driving is 2 mA or less, the laser is considered to pass the screening text. By use of such laser passing the screening test, the constant output power aging test is carried out at conditions of 90° C. and 100 mW. The novel semiconductor laser has a yield of 77% larger than 44% of the conventional laser. The driving current increasing rate is also improved.

Whereas modifications of the present invention will no doubt be apparent to a person having ordinary Skill in the art, to which the invention pertains, it is to be understood that embodiments shown and described by way of illustrations are by no means intended to be considered in a limiting sense. Accordingly, it is to be intended to cover by claims any modifications of he present invention which fall within the spirit and scope of the invention.

What is claimed is:

1. A semiconductor double heterostructure being formed on a GaAs substrate having a plane set off by an angle from the just (100) plane slightly tilted toward a predetermined direction, said double heterostructure including an InGaAs quantum well active strained layer sandwiched between potential barrier layers and including an interface between said InGaAs quantum well active strained layer and an upper potential barrier layer grown on said active strained layer, wherein said interface has a periodical ridge-like bunching structure comprising quadrilateral waveform parts and triangular waveform parts, each of said quadrilateral waveform parts comprises a series of a bottom terrace of said just (100) plane, a reverse direction multiple step plane largely tilted from (100) direction toward the opposite direction to said predetermined direction, a top terrace of said just (100) plane and a forward direction multiple step plane largely tilted from (100) direction toward said predetermined direction, each of said triangular waveform parts comprises a terrace of said just (100) plane and a plane parallel to said forward direction multiple step plane largely tilted from (100) direction toward said predetermined direction.

2. The semiconductor double heterostructure as claimed in claim 1, wherein said quadrilateral waveform parts occupy at least a half or more of said interface between said InGaAs quantum well active strained layer and said upper potential barrier layer.

3. The semiconductor double heterostructure as claimed in claim 1, wherein said GaAs substrate may be tilted by an angle in the range of from 0.5° to 1° from (100) plane toward (0 1 −1) direction.

4. The semiconductor double heterostructure as claimed in claim 1, wherein said barrier layer comprises a GaAs layer.

5. The semiconductor double heterostructure as claimed in claim 1, wherein said double heterostructure is grown by an organometallic vapor phase epitaxy in an atmospheric pressure.

6. A semiconductor double heterostructure being formed on a GaAs substrate having a plane set off by an angle from the just (100) plane slightly tilted toward a predetermined direction, said double heterostructure including a plurality of InGaAs quantum well active strained layers, each of said InGaAs quantum well active strained layers being sandwiched between potential barrier layers and said double heterostructure including interfaces, each of which is defined between said InGaAs quantum well active strained layer and an upper potential barrier layer grown on said active strained layer, wherein each of said interfaces has a periodical ridge-like bunching structure comprising quadrilateral waveform parts and triangular waveform parts, each of said quadrilateral waveform parts comprises a series of a bottom terrace of said just (100) plane, a reverse direction multiple step plane largely tilted from (100) direction toward the opposite direction to said predetermined direction, a top terrace of said just (100) plane and a forward direction multiple step plane largely tilted from (100) direction toward said predetermined direction, each of said triangular waveform parts comprises a terrace of said just (100) plane and a plane parallel to said forward direction multiple step plane largely tilted from (100) direction toward said predetermined direction.

7. The semiconductor double heterostructure as claimed in claim 6, wherein said quadrilateral waveform parts occupy at least a half or more of said interface between said InGaAs quantum well active strained layer and said upper potential barrier layer.

8. The semiconductor double heterostructure as claimed in claim 6, wherein said GaAs substrate may be tilted by an angle in the range of from 0.5° to 1° from (100) plane toward (0 1 −1) direction.

9. The semiconductor double heterostructure as claimed in claim 6, wherein said barrier layer comprises a GaAs layer.

10. The semiconductor double heterostructure as claimed in claim 6, wherein said double heterostructure is grown by an organometallic vapor phase epitaxy in an atmospheric pressure.

11. A semiconductor laser comprising a wafer being formed on a GaAs substrate having a plane set off by an angle from the just (100) plane slightly tilted toward a predetermined direction and ridge waveguides formed on said wafer, said wafer having a double heterostructure including an InGaAs quantum well active strained layer sandwiched between potential barrier layers and including an interface between said InGaAs quantum well active strained layer and an upper potential barrier layer grown on said active strained layer, wherein said interface has a periodical ridge-like bunching structure comprising quadrilateral waveform parts and triangular waveform parts, each of said quadrilateral waveform parts comprises a series of a bottom terrace of said just (100) plane, a reverse direction multiple step plane largely tilted from (100) direction toward the opposite direction to said predetermined direction, a top terrace of said just (100) plane and a forward direction multiple step plane largely tilted from (100) direction toward said predetermined direction, each of said triangular waveform parts comprises a terrace of said just (100) plane and a plane parallel to said forward direction multiple step plane largely tilted from (100) direction toward said predetermined direction.

12. The semiconductor laser as claimed in claim 11, wherein said quadrilateral waveform parts occupy at least a half or more of said interface between said InGaAs quantum well active strained layer and said upper potential barrier layer.

13. The semiconductor laser as claimed in claim 11, wherein said GaAs substrate may be tilted by an angle in the range of from 0.5° to 1° from (100) plane toward (0 1 −1) direction.

14. The semiconductor laser as claimed in claim 11, wherein said barrier layer comprises a GaAs layer.

15. The semiconductor laser as claimed in claim 11, wherein said double heterostructure is grown by an organometallic vapor phase epitaxy in an atmospheric pressure.

16. A semiconductor laser comprising a wafer being formed on a GaAs substrate having a plane set off by an angle from the just (100) plane slightly tilted toward a predetermined direction and ridge waveguides formed on said wafer, said wafer having a double heterostructure including a plurality of InGaAs quantum well active strained layers, each of said InGaAs quantum well active strained layers being sandwiched between potential barrier layers and said double heterostructure including interfaces, each of which is defined between said InGaAs quantum well active strained layer and an upper potential barrier layer grown on said active strained layer, wherein said interface has a periodical ridge-like bunching structure comprising quadrilateral waveform parts and triangular waveform parts, each of said quadrilateral waveform parts comprises a series of a bottom terrace of said just (100) plane, a reverse direction multiple step plane largely tilted from (100) direction toward the opposite direction to said predetermined direction, a top terrace of said just (100) plane and a forward direction multiple step plane largely tilted from (100) direction toward said predetermined direction, each of said triangular waveform parts comprises a terrace of said just (100) plane and a plane parallel to said forward direction multiple step plane largely tilted from (100) direction toward said predetermined direction.

17. The semiconductor laser as claimed in claim 16, wherein said quadrilateral waveform parts occupy at least a half or more of said interface between said InGaAs quantum well active strained layer and said upper potential barrier layer.

18. The semiconductor laser as claimed in claim 16, wherein said GaAs substrate may be tilted by an angle in the range of from 0.5° to 1° from (100) plane toward (0 1 −1) direction.

19. The semiconductor laser as claimed in claim 16, wherein said barrier layer comprises a GaAs layer.

20. The semiconductor laser as claimed in claim 16, wherein said double heterostructure is grown by an organometallic vapor phase epitaxy in an atmospheric pressure.

\* \* \* \* \*